United States Patent
Kim et al.

(10) Patent No.: US 12,208,417 B2
(45) Date of Patent: Jan. 28, 2025

(54) FLAT-PLATE FOCUSING ULTRASONIC TRANSDUCER AND ACOUSTIC LENS WHICH ARE COMPOSED OF ANNULAR ARRAY PIEZOELECTRIC ELEMENT, AND METHODS OF MANUFACTURING AND DESIGNING THEREOF

(71) Applicant: KOREA RESEARCH INSTITUTE OF STANDARDS AND SCIENCE, Daejeon (KR)

(72) Inventors: Yong Tae Kim, Daejeon (KR); Kyung Min Baik, Daejeon (KR); Sung Mok Kim, Daejeon (KR); Hyung Jin Lee, Daejeon (KR); Il Doh, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 924 days.

(21) Appl. No.: 17/325,669

(22) Filed: May 20, 2021

(65) Prior Publication Data
US 2022/0241818 A1    Aug. 4, 2022

(30) Foreign Application Priority Data
Jan. 29, 2021  (KR) .................. 10-2021-0013200

(51) Int. Cl.
*B06B 1/06* (2006.01)
*H10N 30/06* (2023.01)

(52) U.S. Cl.
CPC .......... *B06B 1/0625* (2013.01); *H10N 30/06* (2023.02)

(58) Field of Classification Search
CPC ........ B06B 1/06; B06B 1/0607; B06B 1/0625
(Continued)

(56) References Cited

U.S. PATENT DOCUMENTS 2,875,355 A * 2/1959 Petermann ............. G10K 11/32
310/366

FOREIGN PATENT DOCUMENTS

KR    1020030082303 A    10/2003
KR    1020120004896 A    1/2012
(Continued)

*Primary Examiner* — Derek J Rosenau
(74) *Attorney, Agent, or Firm* — Hoffmann & Baron, LLP

(57) ABSTRACT

The present invention relates to a flat-plate focusing ultrasonic transducer and an acoustic lens composed of an annular array piezoelectric element and methods of manufacturing and designing thereof, more particularly to a flat-plate focusing ultrasonic transducer composed of an annular array piezoelectric element, wherein the annular array piezoelectric element has a plurality of concentric regions which is concentrically arranged in a concentric circle shape with respect to a center point, the concentric region has ring shaped sound insulation regions and piezoelectric regions which are alternatively formed in a direction from the center point to a radius direction, so as to focus a sound wave near a focal point, wherein the piezoelectric regions are composed of a piezoelectric ring that is composed of a piezoelectric material and thus excites a sound wave, the concentric region is in a shape of a flat-plate of which both sides are flat and which has a constant thickness, and each radius of the plurality of the sound insulation regions and the piezoelectric regions in the concentric region are calculated based on a set focal length of the ultrasonic transducer and a frequency of a set sound wave.

16 Claims, 16 Drawing Sheets
(4 of 16 Drawing Sheet(s) Filed in Color)

(58) Field of Classification Search
USPC .......................................... 310/322, 334, 335
See application file for complete search history.

(56) References Cited

FOREIGN PATENT DOCUMENTS

| | | | |
|---|---|---|---|
| KR | 1020150091373 | A | 8/2015 |
| KR | 1020150096401 | A | 8/2015 |
| KR | 101860198 | B1 | 6/2018 |
| KR | 101927635 | B1 | 12/2018 |
| KR | 101955786 | B1 | 3/2019 |
| KR | 101955787 | B1 | 3/2019 |

\* cited by examiner

| index | ring radius(mm) | | | | | | | | | |
|---|---|---|---|---|---|---|---|---|---|---|
| | 1 MHz | 2 MHz | 3 MHz | 4 MHz | 5 MHz | 6 MHz | 7 MHz | 8 MHz | 9 MHz | 10 MHz |
| b1 | 6.8 | 4.8 | 3.9 | 3.4 | 3.0 | 2.8 | 2.6 | 2.4 | 2.3 | 2.2 |
| b2 | 9.7 | 6.8 | 5.6 | 4.8 | 4.3 | 3.9 | 3.6 | 3.4 | 3.2 | 3.0 |
| b3 | 12.0 | 8.4 | 6.8 | 5.9 | 5.3 | 4.8 | 4.5 | 4.2 | 3.9 | 3.7 |
| b4 | 13.9 | 9.7 | 7.9 | 6.8 | 6.1 | 5.6 | 5.2 | 4.8 | 4.5 | 4.3 |
| b5 | 15.7 | 10.9 | 8.9 | 7.7 | 6.8 | 6.2 | 5.8 | 5.4 | 5.1 | 4.8 |
| b6 | 17.3 | 12.0 | 9.7 | 8.4 | 7.5 | 6.8 | 6.3 | 5.9 | 5.6 | 5.3 |
| b7 | 18.8 | 13.0 | 10.5 | 9.1 | 8.1 | 7.4 | 6.8 | 6.4 | 6.0 | 5.7 |
| b8 | 20.2 | 13.9 | 11.3 | 9.7 | 8.7 | 7.9 | 7.3 | 6.8 | 6.4 | 6.1 |
| b9 | 21.5 | 14.8 | 12.0 | 10.3 | 9.2 | 8.4 | 7.8 | 7.3 | 6.8 | 6.5 |
| b10 | 22.8 | 15.7 | 12.7 | 10.9 | 9.7 | 8.9 | 8.2 | 7.7 | 7.2 | 6.8 |
| b11 | 24.1 | 16.5 | 13.3 | 11.5 | 10.2 | 9.3 | 8.6 | 8.0 | 7.6 | 7.2 |
| b12 | 25.3 | 17.3 | 13.9 | 12.0 | 10.7 | 9.7 | 9.0 | 8.4 | 7.9 | 7.5 |
| b13 | 26.5 | 18.0 | 14.5 | 12.5 | 11.1 | 10.1 | 9.4 | 8.8 | 8.2 | 7.8 |
| b14 | 27.6 | 18.8 | 15.1 | 13.0 | 11.6 | 10.5 | 9.7 | 9.1 | 8.6 | 8.1 |
| b15 | 28.7 | 19.5 | 15.7 | 13.5 | 12.0 | 10.9 | 10.1 | 9.4 | 8.9 | 8.4 |

| Ring id | Ring radii (mm) | |
|---|---|---|
| | index | f=1 MHz |
| 1 | b1 | 10.569 |
| | b2 | 14.983 |
| 2 | b3 | 18.395 |
| | b4 | 21.293 |
| 3 | b5 | 23.864 |
| | b6 | 26.204 |
| 4 | b7 | 28.372 |
| | b8 | 30.403 |
| 5 | b9 | 32.324 |
| | b10 | 34.153 |
| 6 | b11 | 35.904 |
| | b12 | 37.588 |
| 7 | b13 | 39.214 |
| | b14 | 40.789 |
| 8 | b15 | 42.318 |
| | b16 | 43.806 |
| 9 | b17 | 45.257 |
| | b18 | 46.675 |
| 10 | b19 | 48.063 |
| | b20 | 49.423 |

FIG. 9A

| Ring id | Ring radii (mm) | |
|---|---|---|
| | index | f=1 MHz |
| 1 | a0 | 50.000 |
| | a1 | 48.651 |
| 2 | a2 | 47.276 |
| | a3 | 45.871 |
| 3 | a4 | 44.435 |
| | a5 | 42.963 |
| 4 | a6 | 41.452 |
| | a7 | 39.897 |
| 5 | a8 | 38.294 |
| | a9 | 36.636 |
| 6 | a10 | 34.915 |
| | a11 | 33.121 |
| 7 | a12 | 31.242 |
| | a13 | 29.261 |
| 8 | a14 | 27.155 |
| | a15 | 24.895 |
| 9 | a16 | 22.432 |
| | a17 | 19.691 |
| 10 | a18 | 16.534 |
| | a19 | 12.653 |
| 11 | a20 | 6.92 |
| | a21 | complex number |

FIG. 9B

| Ring id | Ring radii (mm) | |
|---|---|---|
| | index | f=1 MHz |
| 1 | b0 | 20.000 |
| | b1 | 22.708 |
| 2 | b2 | 25.145 |
| | b3 | 27.387 |
| 3 | b4 | 29.477 |
| | b5 | 31.447 |
| 4 | b6 | 33.316 |
| | b7 | 35.102 |
| 5 | b8 | 36.816 |
| | b9 | 38.468 |
| 6 | b10 | 40.066 |
| | b11 | 41.615 |
| 7 | b12 | 43.122 |
| | b13 | 44.590 |
| 8 | b14 | 46.023 |
| | b15 | 47.424 |
| 9 | b16 | 48.797 |
| | b17 | 50.142 |
| 10 | b18 | 51.464 |
| | b19 | 52.762 |

FIG. 9C

FLAT-PLATE FOCUSING ULTRASONIC TRANSDUCER AND ACOUSTIC LENS WHICH ARE COMPOSED OF ANNULAR ARRAY PIEZOELECTRIC ELEMENT, AND METHODS OF MANUFACTURING AND DESIGNING THEREOF

CROSS-REFERENCE TO RELATED APPLICATIONS

The present application claims priority to Korean Patent Application No. 10-2021-0013200, filed on Jan. 29, 2021, the entire contents of which are incorporated herein by reference.

BACKGROUND

Technical Field

The present invention relates to a flat-plate focusing ultrasonic transducer and an acoustic lens which are composed of an annular array piezoelectric element, and methods of manufacturing and designing thereof.

Description of the Related Art

An ultrasonic transducer is a device which converts an electric signal into an ultrasonic signal, or converts an ultrasonic signal into an electric signal.

The ultrasonic wave is a sound wave having a frequency higher than an audible frequency band of human hearing, that is, higher than 20 kHz. Humans cannot bear the ultrasonic wave using a sense of hearing. The ultrasonic wave is widely utilized in various fields and provides convenience in lots of area of our life.

For example, the ultrasonic wave is used for a medical imaging diagnostic instrument. When the ultrasonic wave is used, a photograph or an image of a body tissue or an organ may be obtained by a non-invasion method.

Further, the ultrasonic transducer may be used to detect an external object. That is, when an ultrasonic signal is output using the ultrasonic transducer and then the output ultrasonic signal returns by being reflected from the external object, the reflected ultrasonic signal is received to measure a time taken while the ultrasonic signal returns. Presence of the external object and a distance to the external object may be calculated using the measured time.

There are three types of ultrasonic transducers that are used currently, for example, an ultrasonic transducer using a magnetic field, an ultrasonic transducer using an electric field, and an ultrasonic transducer using a piezoelectric material.

Among the three types of ultrasonic transducers, the ultrasonic transducer using a piezoelectric material is widely used because it is advantageous to reduce size and has good durability in a high frequency band (an ultrasonic band).

A piezoelectric effect is a phenomenon in which when a mechanical vibration is applied, a potential difference is generated in a crystal. Conversely, the piezoelectric effect also includes a phenomenon in which when an electric field is applied to the crystal, a mechanical vibration is generated.

Therefore, an ultrasonic transducer using a piezoelectric element generates an ultrasonic wave by a vibration generated in the piezoelectric element by applying an electric field to the piezoelectric element.

Among materials which form the piezoelectric element, Rochelle salt and quartz are single crystals, and Barium titanate ($BaTiO3$) and Lead titanate ($PbTiO3$), Lead zirconate system ($PbZrO3$) are multi-crystals.

When the above-mentioned piezoelectric characteristic is used, a converter for generating an ultrasonic wave, a converter for reception, or a converter for transmitting and receiving a signal may be manufactured.

In the meantime, when the ultrasonic transducer is used to detect an external object or for a visual auxiliary device for a visually impaired person, a directivity of an ultrasonic signal which is generally output is not an important factor. However, a high directivity is required to receive the ultrasonic signal.

Further, a focusing ultrasonic transducer is configured to include an acoustic lens to focus an ultrasonic wave which is excited by an ultrasonic shaker near a focal point.

FIG. 1 illustrates a cross-sectional view of an ultrasonic transducer 1 to which a spherical acoustic lens 2 of the related art is applied. As illustrated in FIG. 1, an ultrasonic shaker 10 excites an ultrasonic wave so that the ultrasonic wave enters the acoustic lens 2. The entering ultrasonic wave is focused near a focal point by the acoustic lens 2.

It is understood that an ultrasonic wave emitting surface of the acoustic lens 2 of the related art is configured by a concave surface having a predetermined radius curvature which is recessed toward an entering surface. However, in the case of the spherical acoustic lens 2 of the related art, an impedance of a material for the acoustic lens needs to be lower than an impedance of a material of the ultrasonic shaker 10 and higher than an impedance of a transmitting material. Therefore, a selectable material is limited thereto.

Further, a large thickness of the spherical acoustic lens 2 of the related art is inevitable due to the curvature radius, so that it is difficult to reduce weight and size.

PRIOR ART DOCUMENTS

Patent Documents (Patent Document 1) Korean Patent Application Publication No. 10-2012-0004896
(Patent Document 2) Korean Patent Application Publication No. 10-2003-0082303
(Patent Document 3) Korean Patent Application Publication No. 10-2015-0096401
(Patent Document 4) Korean Patent Application Publication No. 10-2015-0091373
(Patent Document 5) Korean Patent Publication No. 1927635
(Patent Document 6) Korean Patent Publication No. 1955787
(Patent Document 7) Korean Patent Publication No. 1955786
(Patent Document 8) Korean Patent Publication No. 1860198

SUMMARY

Therefore, the present invention is provided to solve the aforementioned problems of the prior art. According to an embodiment of the present invention, an object to be achieved in the present invention is to provide a flat-plate focusing ultrasonic transducer and an acoustic lens, which are composed of an annular array piezoelectric element and methods of manufacturing and designing thereof. In the flat-plate focusing ultrasonic transducer, a piezoelectric element in an array of Fresnel Zone Plate (FZP) is capable of designing each radius in concentric regions rapidly and efficiently, and thus it is not needed to use a curved piezoelectric element and is also easy to focus an ultrasonic wave on a designed focal point.

According to an embodiment of the present invention, an object to be achieved by the present invention is to provide a flat-plate focusing ultrasonic transducer and an acoustic lens which are composed of an annular array piezoelectric element and methods of manufacturing and designing thereof. In the flat-plate focusing ultrasonic transducer, a radius of an outermost concentric circle is fixed and each radius of inward concentric regions is determined by Equation 2 so that an outer diameter of the annular array is not changed even when the number of the concentric regions is changed, or a radius of an innermost concentric circle is fixed and each radius of outward concentric regions is determined by Equation 3 so that an inner diameter of the annular array is not changed even when the number of the concentric regions is changed. Therefore, a focal point is formed on a fixed position even when the number of concentric regions is changed, length and width of a major axis of a focused beam are adjusted by changing the number of the concentric regions, and the concentric regions are combined selectively.

Further, according to the present invention, an object to be achieved in the present invention is to provide a flat-plate focusing ultrasonic transducer and an acoustic lens which are composed of an annular array piezoelectric element and methods of manufacturing and designing thereof. The flat-plate focusing ultrasonic transducer is capable of focusing in a frequency besides a designed frequency and of being used when a resonance frequency is formed at a frequency that is lower or higher than the designed frequency.

Meanwhile, technical objects to be solved in the present invention are not limited to the aforementioned objects, and other not-mentioned technical objects will be obviously understood by those skilled in the art from the description below.

According to a first aspect of the present invention, provided is a flat-plate focusing ultrasonic transducer composed of an annular array piezoelectric element, wherein the annular array piezoelectric element has a plurality of concentric regions which is concentrically arranged in a concentric circle shape with respect to a center point, the concentric region has ring shaped sound insulation regions and piezoelectric regions which are alternatively formed in a direction from the center point to a radius direction, so as to focus a sound wave near a focal point, wherein the piezoelectric regions are composed of a piezoelectric ring that is composed of a piezoelectric material and thus excites a sound wave, the concentric region is in a shape of a flat-plate of which both sides are flat and which has a constant thickness, and each radius of the plurality of the sound insulation regions and the piezoelectric regions in the concentric region are calculated based on a set focal length of the ultrasonic transducer and a frequency of a set sound wave.

A maximum radius is determined and fixed, and the each radius of the plurality of the sound insulation regions and the piezoelectric regions in the concentric region is calculated by following Equation 3:

$$a_n = \frac{1}{k}\sqrt{(k^2 a_0^2 + (n\pi)^2) - 2n\pi k\sqrt{a_0^2 + F^2}} \quad \text{[Equation 3]}$$

where $a_n$ is an index of the sequential concentric regions from the maximum radius to an inner radius direction, $a_0$ is the maximum radius ($R_0$), k is a wave number, and F is a focal length.

Further, a minimum radius is determined and fixed, and the each radius of the plurality of the sound insulation regions and the piezoelectric regions in the concentric region are calculated by following Equation 4:

$$b_n = \frac{1}{k}\sqrt{2n\pi k\sqrt{b_0^2 + F^2} + (k^2 b_0^2 + (n\pi)^2)} \quad \text{[Equation 4]}$$

where $b_n$ is an index of the sequential concentric regions in a direction from a primary radius to an outer radius, $b_0$ is the primary radius ($R_b$), k is a wave number, and F is a focal length.

Further, the flat-plate focusing ultrasonic transducer further comprises electrode layers to be laminated on each of the both sides.

Further, a sound insulation material composing the sound insulation regions is air or a sound insulator, the sound insulator having a composite material which induces a scattering process of a sound wave and a matrix material which fills a base of an acoustic absorbent during the scattering process of the sound wave.

Further, the focal length is fixed even if changing the number of the piezoelectric rings, and length and width of a major axis of a focused beam are adjustable by changing the number of the piezoelectric rings.

Further, when the flat-plate focusing ultrasonic transducer is driven with a frequency besides the frequency of the set sound wave, an effective focal length is calculated by following Equation 5:

$$F_{eff} \approx \frac{1}{2\pi k}\sqrt{k^4(a_{2(i-1)}^2 - a_{2i-1}^2)^2 - 2\pi^2 k^2(a_{2(i-1)}^2 + a_{2i-1}^2) + \pi^4} \quad \text{[Equation 5]}$$

where, $a_{2(i-1)}$ is an outer diameter of an $i_{th}$ piezoelectric ring, $a_{2i-1}$ is an inner diameter of an $i_{th}$ piezoelectric ring.

Further, when the flat-plate focusing ultrasonic transducer is driven with a frequency besides the frequency of the set sound wave, an effective focal length is calculated by following Equation 6:

$$F_{eff} \approx \frac{1}{2\pi k}\sqrt{k^4(b_{2i-1}^2 - b_{2(i-1)}^2)^2 - 2\pi^2 k^2(b_{2i-1}^2 + b_{2(i-1)}^2) + \pi^4} \quad \text{[Equation 6]}$$

where, $b_{2(i-1)}$ is an inner diameter of an $i_{th}$ piezoelectric ring, $b_{2i-1}$ is an outer diameter of an $i_{th}$ piezoelectric ring.

According to a second aspect of the present invention, provide is an acoustic lens comprising the aforementioned annular array piezoelectric element according to the first aspect of the present invention.

According to a third aspect of the present invention, provided is a method of designing an annular array piezoelectric element of a focusing ultrasonic transducer or an acoustic lens, wherein the method comprises: designing a desired frequency of a sound wave and a desired focal length; determining and fixing a maximum radius and calculating each radius of a plurality of sound insulation regions and piezoelectric ring shaped piezoelectric regions composed of a piezoelectric material in a concentric region by following Equation 3; determining a minimum radius of a focusing ultrasonic transducer or an acoustic lens to be manufactured and a number of a concentric region; and manufacturing the ultrasonic transducer or the acoustic lens to coincide with the number of the concentric regions, the maximum radius, the minimum radius and the each radius of the sound insulation regions and the piezoelectric regions:

$$a_n = \frac{1}{k}\sqrt{(k^2 a_0^2 + (n\pi)^2) - 2n\pi k\sqrt{a_0^2 + F^2}} \qquad \text{[Equation 3]}$$

where $a_n$ is an index of the sequential concentric regions in a direction from the maximum radius to an inner radius, $a_0$ is the maximum radius ($R_0$), k is a wave number, and F is a focal length.

According to a fourth aspect of the present invention, provided is a method of designing an annular array piezoelectric element included in a focusing ultrasonic transducer or an acoustic lens, wherein the method comprises: designing a desired frequency of a sound wave and a desired focal length; determining and fixing a primary radius and calculating each radius of a plurality of sound insulation regions and piezoelectric ring shaped piezoelectric regions composed of a piezoelectric material in a concentric region by following Equation 4; determining a maximum radius of a focusing ultrasonic transducer or an acoustic lens to be manufactured and a number of the concentric region; and manufacturing the ultrasonic transducer or the acoustic lens to coincide with the number of the concentric regions, the maximum radius, the minimum radius and the each radius of the sound insulation regions and the piezoelectric regions:

$$b_n = \frac{1}{k}\sqrt{2n\pi k\sqrt{b_0^2 + F^2} + (k^2 b_0^2 + (n\pi)^2)} \qquad \text{[Equation 4]}$$

where $b_n$ is an index of the sequential concentric regions in a direction from a primary radius to an outer radius, $b_0$ is the primary radius ($R_b$), k is a wave number, and F is a focal length.

According to the third and fourth aspects of the present invention, in determining the number of the concentric regions, the method comprises adjusting length and width of a major axis of a focused beam by changing the number of the piezoelectric rings.

According to a fifth aspect of the present invention, provided is a method of manufacturing an ultrasonic transducer or an acoustic lens, wherein the method comprises: manufacturing a mold in which a disc shaped protrusion is provided at a center and concentric concave portions and convex portions are alternatively and sequentially formed in a radius direction from the protrusions, coinciding with each radius of the concentric regions in accordance with either method of designing; filling a piezoelectric material in an upper portion of the mold; sealing the filled piezoelectric material by coupling a cap to the upper portion of the mold; removing the cap, detaching the filled piezoelectric material and filling a sound insulator in a region formed by the concave portion and the convex portion of the mold; and coating electrode layers on each of the opposite surface.

After coating the electrode layers, the method of manufacturing further comprises coupling a high-voltage polarizer to the electrode layers and polarizing the piezoelectric material.

According to a sixth aspect of the present invention, provided is a method of manufacturing an ultrasonic transducer or an acoustic lens, wherein the method comprises: preparing a base material of a piezoelectric ring having a maximum radius and a minimum radius according to either method of designing; forming sound insulation regions by laser etching to coincide with each radius of concentric regions according to the method of designing while rotating the base material of a piezoelectric ring with respect to a center point; filling a sound insulator in the sound insulation region; and coating electrode layers on both sides.

According to a seventh aspect of the present invention, provided is a method of manufacturing an ultrasonic transducer or an acoustic lens, wherein the method comprises: preparing a base material of a piezoelectric ring having a maximum radius according to either method of designing; removing a center portion by irradiating lasers so as to form, in the base material of a piezoelectric ring, a center through portion corresponding to a minimum radius according to the method of designing while rotating the base material of a piezoelectric ring with respect to a center point; forming sound insulation regions by laser etching to coincide with each radius of concentric regions according to the method of designing while rotating the base material of a piezoelectric ring with respect to the center point; filling a sound insulator in the sound insulation region; and coating electrode layers on both sides.

Further, the removed center portion is recycled, or the center through portion is not filled with a sound insulator and after an insulation insert is inserted into an inside of the center through portion, both sides of the center portion are coated with electrode layers and the coated center portion is inserted into and coupled to the center through portion.

Advantageous Effects

According to a 3D flow velocity meter according to an embodiment of the present invention, an on-the-spot stack measurement system using the same and a measurement thereof, an object to be achieved according to an embodiment of the present invention is to provide a flat-plate focusing ultrasonic transducer and an acoustic lens which are composed of an annular array piezoelectric element, wherein, through a piezoelectric element array in a shape of Fresnel zone plate (FZP) capable of designing each radius dimension of concentric regions, it is not necessary to use a curved surface of piezoelectric element and is easy to implement focusing on a designed focal point.

Further, an object to be achieved according an embodiment of the present invention is to provide a flat-plate focusing ultrasonic transducer and an acoustic lens which are composed of an annular array piezoelectric element, wherein each radius of inward concentric regions is determined by Equation 2 so that an outer diameter of the annular array is not changed even when the number of the concentric regions is changed, or a radius of an innermost concentric circle is fixed and each radius of outward concentric regions is determined by Equation 3 so that an inner diameter of the annular array is not changed even when the number of the concentric regions is changed. Therefore, a focal point is formed on a fixed position even when the number of concentric regions is changed, length and width of a major axis of a focused beam are adjusted by changing the number of the concentric regions, and the concentric regions are combined selectively.

Further, an object to be achieved according an embodiment of the present invention is to provide a flat-plate focusing ultrasonic transducer and an acoustic lens which are composed of an annular array piezoelectric element, wherein the flat-plate focusing ultrasonic transducer is capable of focusing in a frequency besides a designed frequency and of being used when a resonance frequency is formed at a frequency that is lower or higher than the designed frequency.

Meanwhile, the effects to be achieved by the present disclosure are not limited to the aforementioned effects and other effects, which are not mentioned above, will be apparent to those skilled in the art from the following description.

BRIEF DESCRIPTION OF THE DRAWINGS

The patent or application contains at least one drawing executed in color. Copies of this patent or patent application publication with color drawing(s) will be provided by the U.S. Patent and Trademark Office upon request and payment of the necessary fee.

The accompanying drawings in the specification illustrate an embodiment of the present invention. The technical essence of the present disclosure will be more clearly understood from the following detailed description taken in conjunction with the accompanying drawings. Therefore, the present invention will not be interpreted to be limited to the drawings in which:

FIG. 9A is a table showing radius dimensions of concentric regions according to a conventional designing method;

FIG. 9B is a table showing radius dimensions of concentric regions according to the first embodiment of the present invention;

FIG. 9C is a table showing radius dimensions of concentric regions according to the second embodiment of the present invention;

DETAILED DESCRIPTION

Figure 1:
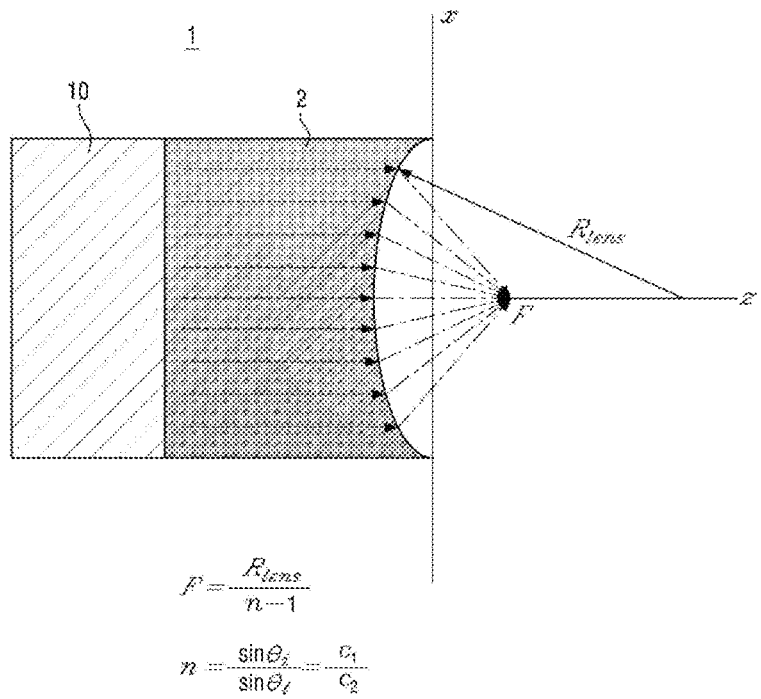
FIG. 1 is a cross-sectional view of an ultrasonic transducer adapting a conventional spherical acoustic lens.

The above and other objects, features, and other advantages of the present disclosure will be more clearly understood from the following detailed description taken in conjunction with the accompanying drawings. As those skilled in the art would realize, the present disclosure is not limited to the described embodiments, but may be embodied in different ways. On the contrary, example embodiments introduced herein are provided to make disclosed contents thorough and complete and sufficiently transfer the essence of the present invention to those skilled in the art.

In this specification, when a component is referred to as being "on" another component, it may be directly on the other component, or an intervening third component may be present. Further, in the drawings, the thicknesses of components are exaggerated for effectively describing the technical contents.

Example embodiments described in this specification may be described with reference to cross-sectional views and/or plan views which are ideal example views of the present disclosure. Further, in the drawings, the thicknesses of film and regions are exaggerated for effectively describing the technical contents. Therefore, a shape of the example view may be modified by a manufacturing technology and/or an allowable error. Accordingly, example embodiments of the present disclosure are not limited to specific illustrated types, but may include modified types which are generated in accordance with the manufacturing process. For example, a region illustrated to have a right angle may be rounded or have a predetermined curvature. Therefore, regions illustrated in the drawings have properties. Shapes of the regions illustrated in the drawings are provided to illustrate a specific shape of a region of an element, but not limit the scope of the present disclosure. Although the terms "first", "second", and the like are used for describing various components, these components are not confined by these terms. These terms are merely used for distinguishing one component from the other components. Example embodiments described herein include complementary embodiments thereof.

The terms used in the present specification are for explaining the embodiments rather than limiting the present invention. Unless particularly stated otherwise in the present specification, a singular form also includes a plural form. The term "comprises" and/or "comprising" used in this specification does not exclude the existence or addition of one or more other components.

When the following specific example embodiments are described, various specific contents are provided for more specific description and understanding of the present disclosure. However, those skilled in the art may understand that the specific example embodiment may be described without using the various specific contents. In some cases, a configuration which is generally known and does not directly relate to the present disclosure will be omitted in order to avoid confusion.

Hereinafter, explained are a configuration and a method of designing a flat-plate focusing ultrasonic transducer or an acoustic lens which are composed of an annular array piezoelectric element.

The configuration of an annular array piezoelectric element 10 to be explained in the present invention may be adopted to a focusing ultrasonic transducer, an acoustic lens or both thereof. Hereinafter, explained is a focusing ultrasonic transducer 100 as an embodiment.

Figure 2:
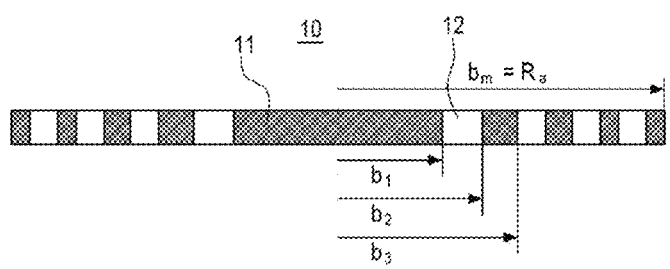
FIG. 2 is a plane view of a flat-plate focusing ultrasonic transducer composed of an annular array piezoelectric element according to an embodiment of the present invention by a conventional designing method.

FIG. 2 is a plane view of a flat-plate focusing ultrasonic transducer composed of an annular array piezoelectric element 10 according to an embodiment of the present invention by a conventional designing method. Further, FIG. 3 is a cross-sectional view of a flat-plate focusing transducer composed of an annular array piezoelectric element according to an embodiment of the present invention by a conventional designing method and FIG. 4 is a diagram explaining a focusing principle of an acoustic lens using a Fresnel zone plate according to an embodiment of the present invention.

Figure 3:
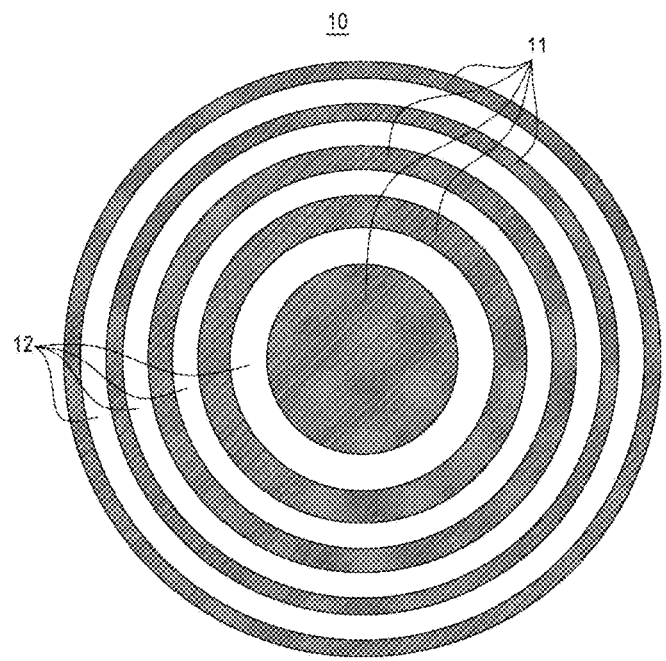
FIG. 3 is a cross-sectional view of a flat-plate focusing transducer composed of an annular array piezoelectric element according to an embodiment of the present invention by a conventional designing method.
Figure 4:
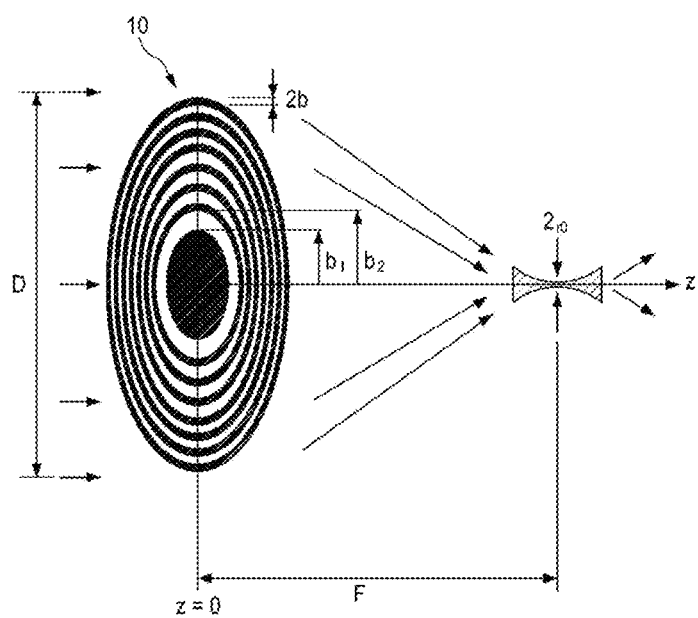
FIG. 4 is a diagram explaining a focusing principle of an acoustic lens using a Fresnel zone plate according to an embodiment of the present invention.

It is seen that the annular array piezoelectric element 10 composing the flat-plate ultrasonic transducer 100 may have a plurality of concentric regions, as shown in FIG. 2, FIG. 3 and FIG. 4.

The concentric region is configured to have ring shaped sound insulation regions 11 and piezoelectric regions 12 which are alternatively formed in a direction from the center point to a radius direction, so as to focus a sound wave near a focal point, wherein the piezoelectric regions are composed of a piezoelectric ring that is composed of a piezoelectric material and thus excites a sound wave, the concentric region. Further, the concentric region is in a shape of a flat-plate of which both sides are flat and which has a constant thickness.

Further, each radius of the plurality of the sound insulation regions 11 and the piezoelectric regions 12 in the concentric region are calculated based on a set focal length of the ultrasonic transducer and a frequency of a set sound wave.

Figures 5, 6:
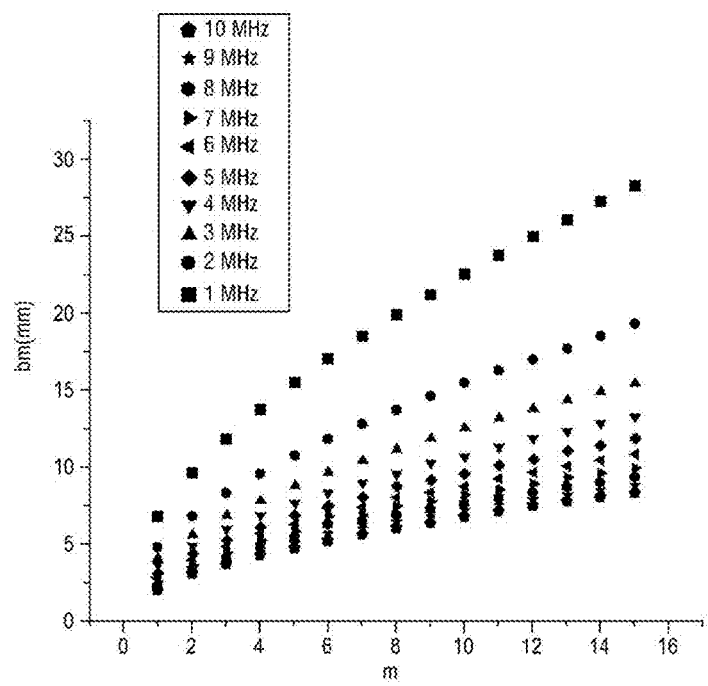
FIG. 5 is a graph of a radius of an acoustic lens with respect to the number of concentric regions by frequencies according to a conventional designing method.
FIG. 6 is a numerical table showing each radius of concentric regions by frequencies when a focal length according to a conventional designing method is 30 mm.

Further, FIG. 5 is a graph of a radius of an acoustic lens with respect to the number of concentric regions by frequencies according to a conventional designing method, and FIG. 6 is a numerical table showing each radius of concentric regions by frequencies when a focal length according to a conventional designing method is 30 mm.

Prior inventions by inventors of the present invention describe an acoustic lens and a focusing ultrasonic transducer using this Fresnel zone plate principle, wherein designing of radius dimensions of concentric regions in which the sound insulation regions 11 and the piezoelectric regions 12 are alternatively formed is based on the following Equation 1 and Equation 2.

According to the basis of this conventional designing method, each radius of a plurality of the sound insulation regions 11 and the piezoelectric regions 12 in the concentric regions are calculated on the basis of a wavelength in a transmission medium in which the wavelength is determined by a set focal length and a frequency of a set sound wave, and the each radius of the plurality of the sound insulations 11 and the piezoelectric regions 12 are calculated by the following Equation 1.

$$b_m = m\lambda\left(F + \frac{m\lambda}{4}\right) \quad \text{[Equation 1]}$$

where m is an index of the sequential concentric regions in a radius direction from a center point, $\lambda$ is a wavelength in the transmission medium, and F is a focal length.

Further, the focal length is defined by the following Equation 2.

$$F = \frac{R_a^2}{m\lambda} - \frac{m\lambda}{4} \quad \text{[Equation 2]}$$

where Ra is a maximum radius of the ultrasonic transducer, $\lambda$ is a wavelength of the sound wave in the transmission medium, and m is the number of the concentric regions.

According to an embodiment of the present invention, through the array of the piezoelectric element 10 in a shape of Fresnel zone plate (FZP) capable of designing each radius dimension of concentric regions, it is not necessary to use a curved surface of piezoelectric element and is easy to implement focusing on a designed focal point.

When the conventional designing method is adopted, radii are calculated from the inside outward (b1, b2, . . . , bm), and an outer diameter D and the number of the concentric regions are determined referring to the table showing the calculated radii in FIG. 6. However, there is a difficulty in setting a dimension of the outer diameter D to the extent of mm accurately (it is involved to adjust a focal length in order to set the same accurately). Further, it will be difficult to control a common difference in the housing of the transducer. Further, in a case of a piezoelectric disc element, a dimension is controlled with a mold and thus a specific diameter is a factor affecting the price increase.

Therefore, the present invention suggests a new designing method of dimension determination.

Figure 7:
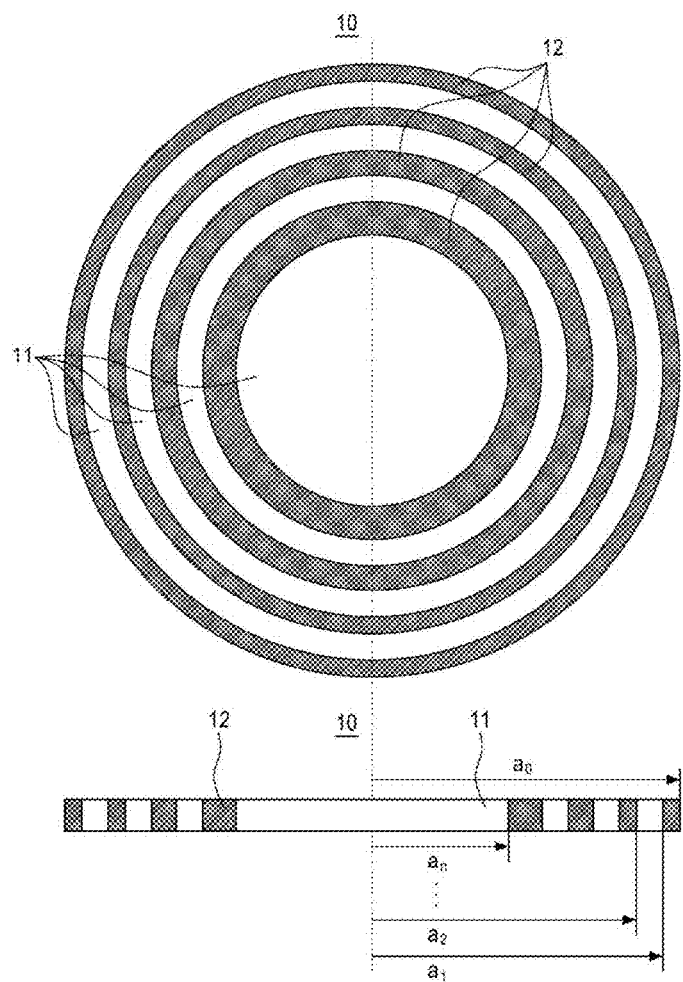
FIG. 7 shows a plane view of a flat-plate focusing ultrasonic transducer composed of an annular array piezoelectric element designed by a designing method according to a first embodiment of the present invention and a cross-sectional view thereof.

FIG. 7 shows a plane view of a flat-plate focusing ultrasonic transducer composed of an annular array piezoelectric element designed by the designing method according to the first embodiment of the present invention and a cross-sectional view thereof.

According to the first embodiment of the present invention, a maximum radius is determined and fixed, and the each radius of the plurality of the sound insulation regions 11 and piezoelectric regions 12 in the concentric region are calculated by following Equation 3:

$$a_n = \frac{1}{k}\sqrt{(k^2 a_0^2 + (n\pi)^2) - 2n\pi k\sqrt{a_0^2 + F^2}}$$ [Equation 3]

where $a_n$ is an index of the sequential concentric regions from the maximum radius to an inner radius direction, $a_0$ is the maximum radius ($R_O$), k is a wave number, and F is a focal length.

Further, the focusing ultrasonic transducer 100 may be configured to comprise electrode layers 30 to be laminated on each of an upper surface and a lower surface thereof. A sound insulation material composing the sound insulation regions 11 is air or a sound insulator, and the sound insulator may be configured to have a composite material which induces a scattering process of a sound wave and a matrix material which fills a base of an acoustic absorbent during the scattering process of the sound wave.

That is, a desired frequency of a sound wave and a desired focal length are designed, and a maximum radius is determined and then fixed. Each radius of a plurality of sound insulation regions 11 and piezoelectric ring shaped piezoelectric regions 12 composed of a piezoelectric material in a concentric region are by following Equation 3.

A minimum radius of the focusing ultrasonic transducer 100 or the acoustic lens to be manufactured and a number of a concentric region are determined, and the ultrasonic transducer 100 or the acoustic lens is manufactured to coincide with the number of the designed concentric regions, the maximum radius, the minimum radius and the each radius of the sound insulation regions 11 and the piezoelectric regions 12.

Figure 8:
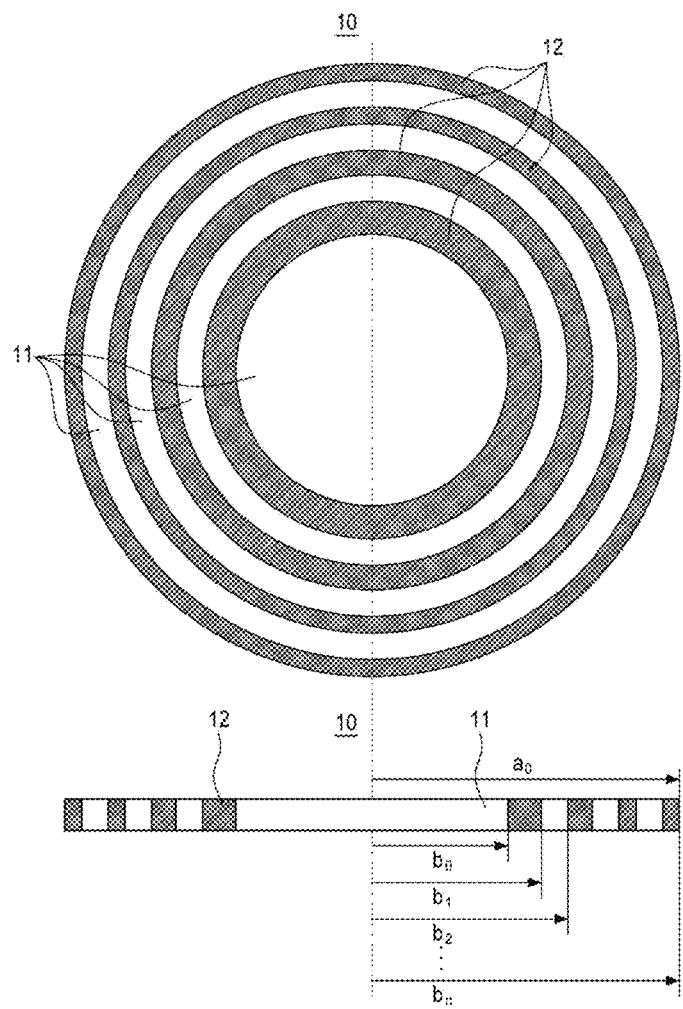
FIG. 8 shows a plane view of a flat-plate focusing ultrasonic transducer composed of an annular array piezoelectric element designed by a designing method according to a second embodiment of the present invention and a cross-sectional view thereof.

FIG. 8 shows a plane view of a flat-plate focusing ultrasonic transducer composed of an annular array piezoelectric element designed by a designing method according to a second embodiment of the present invention and a cross-sectional view thereof.

According to the second embodiment of the present invention, a minimum radius is determined and fixed, and the each radius of the plurality of the sound insulation regions 11 and the piezoelectric regions 12 in the concentric region are calculated by following Equation 4:

$$b_n = \frac{1}{k}\sqrt{2n\pi k\sqrt{b_0^2 + F^2} + (k^2 b_0^2 + (n\pi)^2)}$$ [Equation 4]

where $b_n$ is an index of the sequential concentric regions in a direction from a primary radius to an outer radius, $b_0$ is the primary radius ($R_b$), k is a wave number, and F is a focal length. The focusing ultrasonic transducer 100 may be configured to comprise the electrode layers 30 to be laminated on each of the upper surface and the lower surface thereof.

That is, a desired frequency of a sound wave and a desired focal length are designed, and a primary radius is determined and then fixed. Each radius of the plurality of the sound insulation regions 11 and the piezoelectric ring shaped piezoelectric regions 12 composed of a piezoelectric material in a concentric region are by following Equation 4.

A minimum radius of the focusing ultrasonic transducer 100 or the acoustic lens to be manufactured and a number of the concentric region are determined, and the ultrasonic transducer 100 or the acoustic lens is manufactured to coincide with the number of the designed concentric regions, the maximum radius, the minimum radius and the each radius of the sound insulation regions 11 and the piezoelectric regions 12

FIG. 9A is a table showing radius dimensions of concentric regions according to a conventional designing method. FIG. 9B is a table showing radius dimensions of concentric regions according to the first embodiment of the present invention. FIG. 9C is a table showing radius dimensions of concentric regions according to the second embodiment of the present invention.

A conventional designing method follows Equation 1 as shown in FIG. 9A, wherein a focal length and a frequency are designed to be 75 mm and 1 MHz, respectively; a sound velocity is 1482 m/s; a maximum radius and a minimum radius are 48.188 mm and 10.075 mm, respectively; and the number of the piezoelectric rings 12 is 10. According to the conventional designing method, it is not allowable to fix one of the radii of the rings.

The first embodiment of the present invention follows Equation 3 as shown in FIG. 9B, wherein a focal length and a frequency are designed to be 75 mm and 1 MHz, respectively; a sound velocity is 1482 m/s; when a maximum radius is designed to be fixed 50 mm, a dimension of a twenty-second ($22^{nd}$) concentric region becomes a complex number and thus the number of the piezoelectric rings 12 is limited to 10 (the number of concentric circle is 20); and a minimum radius is 12.653 mm According to the designing method according to the first embodiment, it is capable of designing the fixed maximum radius.

The second embodiment of the present invention follows Equation 4 as shown in FIG. 9C, wherein a focal length and a frequency are designed to be 75 mm and 1 MHz, respectively; a sound velocity is 1482 m/s; when a primary radius is designed to be fixed 20 mm, the number of the concentric circles (the number of the piezoelectric rings 12) is not limited; but when the number of the piezoelectric rings 12 is limited to 10, a maximum radius is 52.762 mm According to the designing method according to the second embodiment, it is capable of designing the fixed minimum radius.

Figure 10:
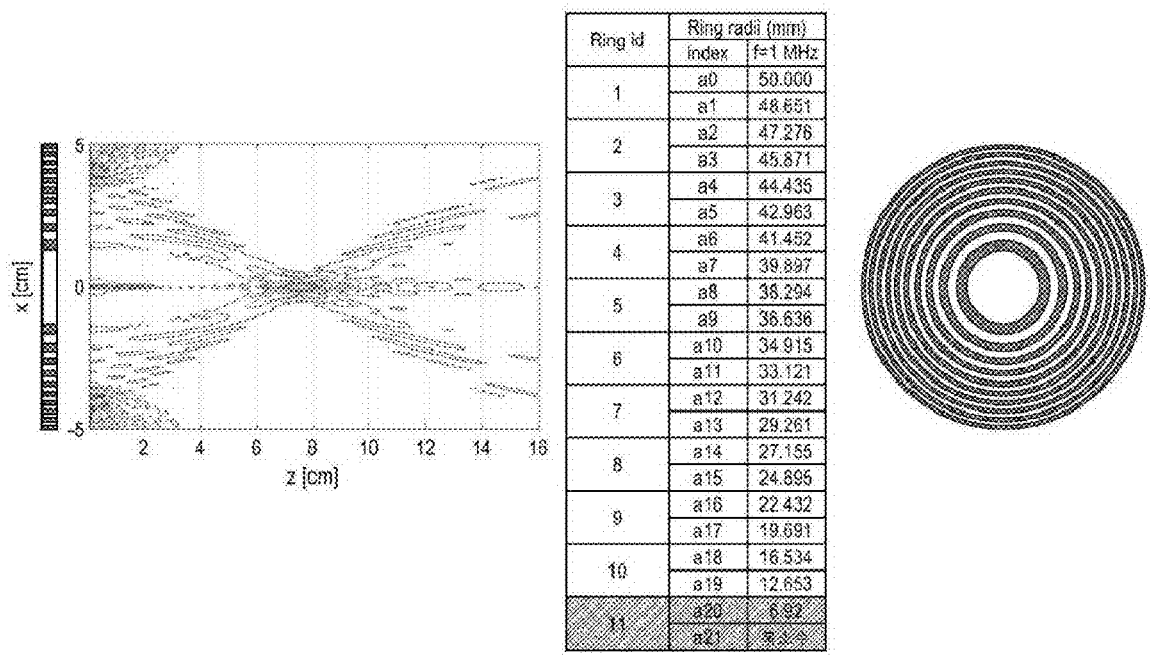
FIG. 10 shows a plane view of a flat-plate focusing ultrasonic transducer having piezoelectric rings according to the first embodiment of the present invention, and a sound-field spatial distribution diagram thereof.

FIG. 10 shows a plane view of a flat-plate focusing ultrasonic transducer having piezoelectric rings according to the first embodiment of the present invention, and a sound-field spatial distribution diagram thereof. In the first embodiment, the biggest possible number of the piezoelectric rings was 10, wherein when a maximum radius is 50 mm and a designed frequency is 1 MHz, focusing is accomplished at a designed focal length of 75 mm as shown in FIG. 10.

Figure 11:
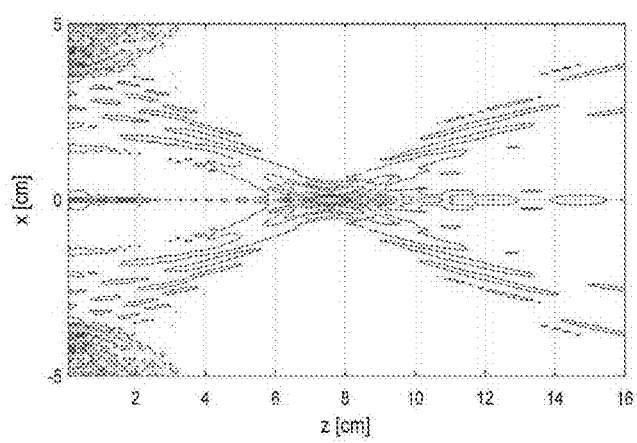
FIG. 11 shows a plane view of a flat-plate focusing ultrasonic transducer having piezoelectric rings according to the second embodiment of the present invention, and a sound-field spatial distribution diagram thereof.

FIG. 11 shows a plane view of a flat-plate focusing ultrasonic transducer having piezoelectric rings according to the second embodiment of the present invention, and a sound-field spatial distribution diagram thereof. In the second embodiment of the present invention, the number of the piezoelectric rings 12 is not limited, however, when the number of the piezoelectric rings 12 is 10, a minimum radius is 20 mm and a designed frequency is 1 MHz, focusing is accomplished at a focal length of 75 mm as shown in FIG. 11.

Figure 12:
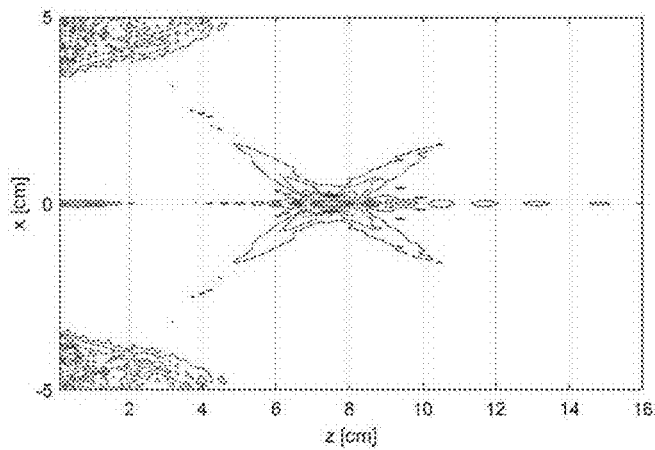
FIG. 12 shows a plane view of a flat-plate focusing ultrasonic transducer having piezoelectric rings according to the second embodiment of the present invention, and a sound-field spatial distribution diagram thereof.

FIG. 12 shows a plane view of a flat-plate focusing ultrasonic transducer having piezoelectric rings according to the second embodiment of the present invention, and a sound-field spatial distribution diagram thereof. As shown in FIG. 12, in the second embodiment of the present invention, when the number of the piezoelectric rings 12 is 15, a minimum radius is 20 mm and a designed frequency is 1 MHz, a maximum radius is 64.790 mm and focusing is accomplished at a focal length of 75 mm That is, it can be seen that even though the number of the piezoelectric rings 12 is changed, focusing is accomplished at the set focal length.

Figure 13:
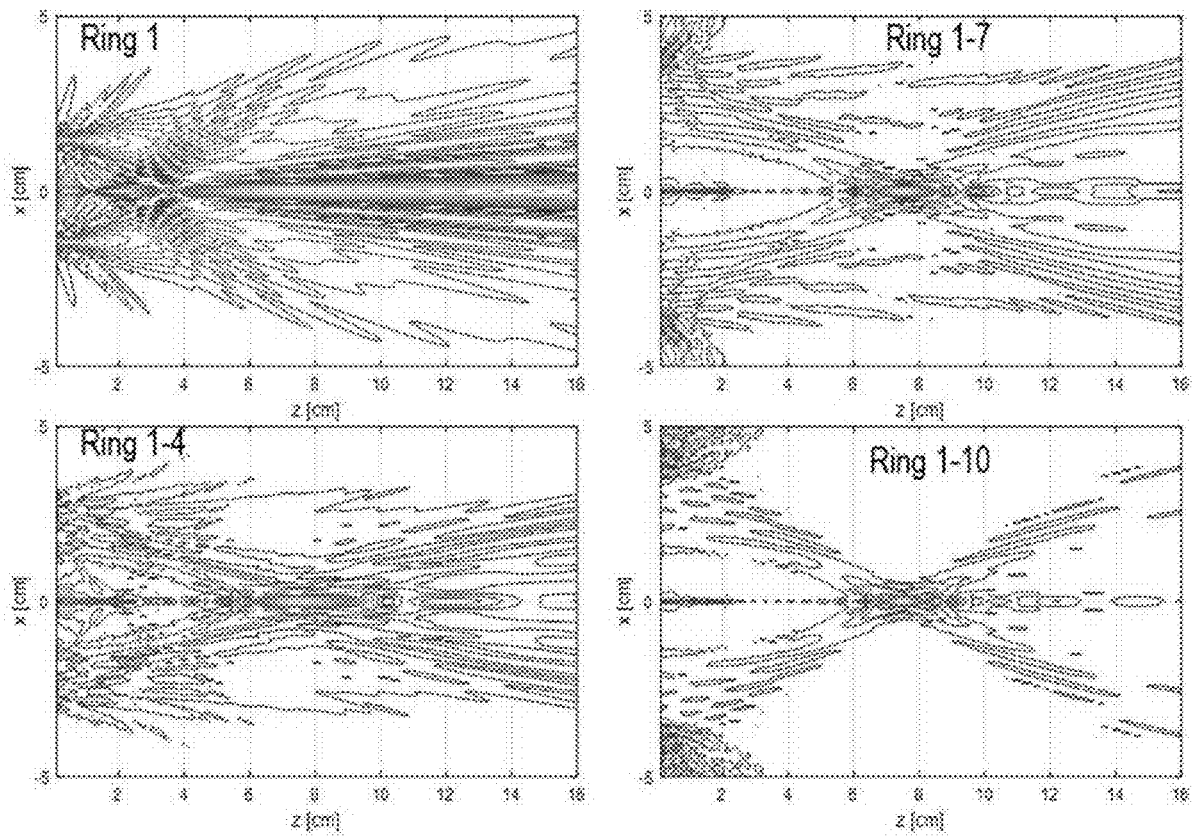
FIG. 13 shows sound-field spatial distribution diagrams of flat-plate focusing ultrasonic transducers having 1, 4, 7, and 10 piezoelectric ring(s), respectively according to the first embodiment of the present invention.
Figure 14:
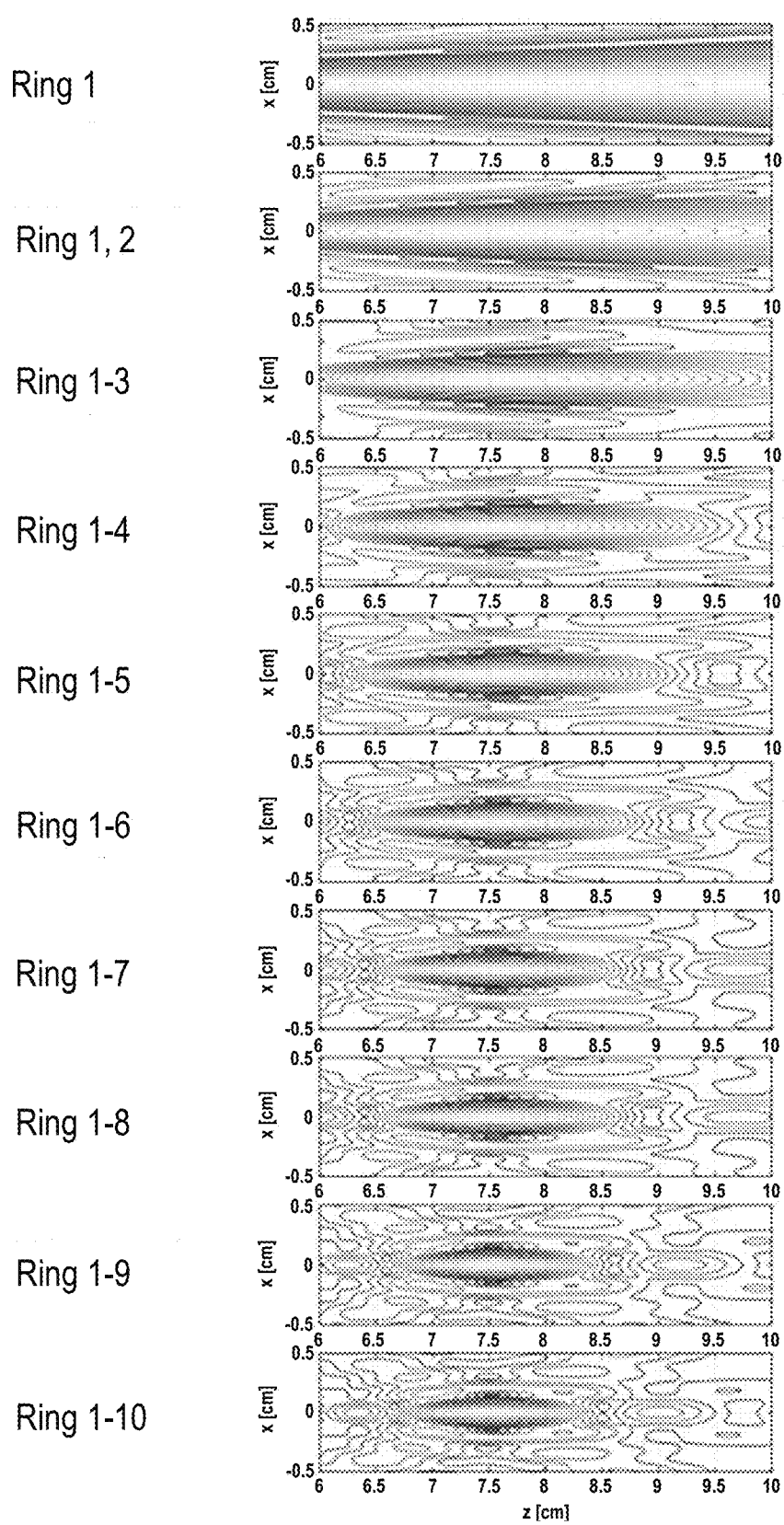
FIG. 14 shows sound-field spatial distribution diagrams of flat-plate focusing ultrasonic transducers having 1 to 10 piezoelectric ring(s), respectively, according to the first embodiment of the present invention.

FIG. 13 shows sound-field spatial distribution diagrams of flat-plate focusing ultrasonic transducers having 1, 4, 7, and 10 piezoelectric ring(s), respectively according to the first embodiment of the present invention. FIG. 14 illustrates sound-field spatial distribution diagrams of the flat-plate focusing ultrasonic transducers having 1, 4, 7, and piezoelectric ring(s) 12, respectively according to the first embodiment of the present invention.

As shown in FIG. 13 and FIG. 14, it can be seen that even though the number of the piezoelectric ring(s) 12 is changed, the focal point is formed at a constant distance.

Figure 15A:
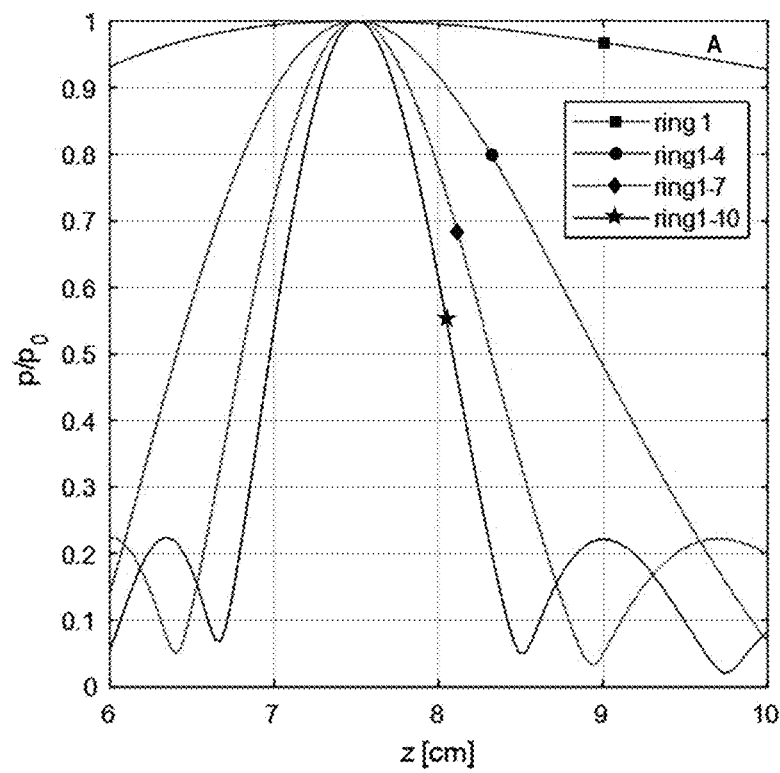
FIG. 15A is a comparative graph of beam lengths of major axes of flat-plate focusing ultrasonic transducers having 1, 4, 7, and 10 piezoelectric ring(s), respectively according to the first embodiment of the present invention.
Figure 15B:
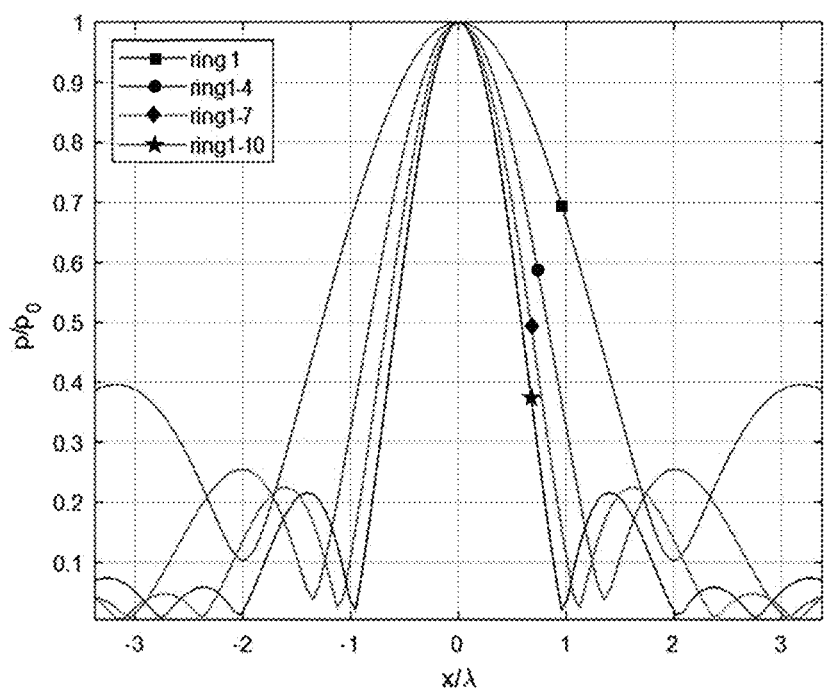
FIG. 15B is a comparative graph of beam widths of major axes of flat-plate focusing ultrasonic transducers having 1, 4, 7, and 10 piezoelectric ring(s), respectively according to the first embodiment of the present invention.

FIG. 15A is a comparative graph of lengths of major axes of focusing beams of flat-plate focusing ultrasonic transducers having 1, 4, 7, and 10 piezoelectric ring(s), respectively according to the first embodiment of the present invention, and FIG. 15B is a comparative graph of widths of major axes of focusing beams of the flat-plate focusing ultrasonic transducers having 1, 4, 7, and 10 piezoelectric ring(s), respectively according to the first embodiment of the present invention.

That is, it can be seen that it is allowable to adjust the length and the width of the major axis of the focusing beam according to the design of the number of the piezoelectric ring 12.

Figure 16:
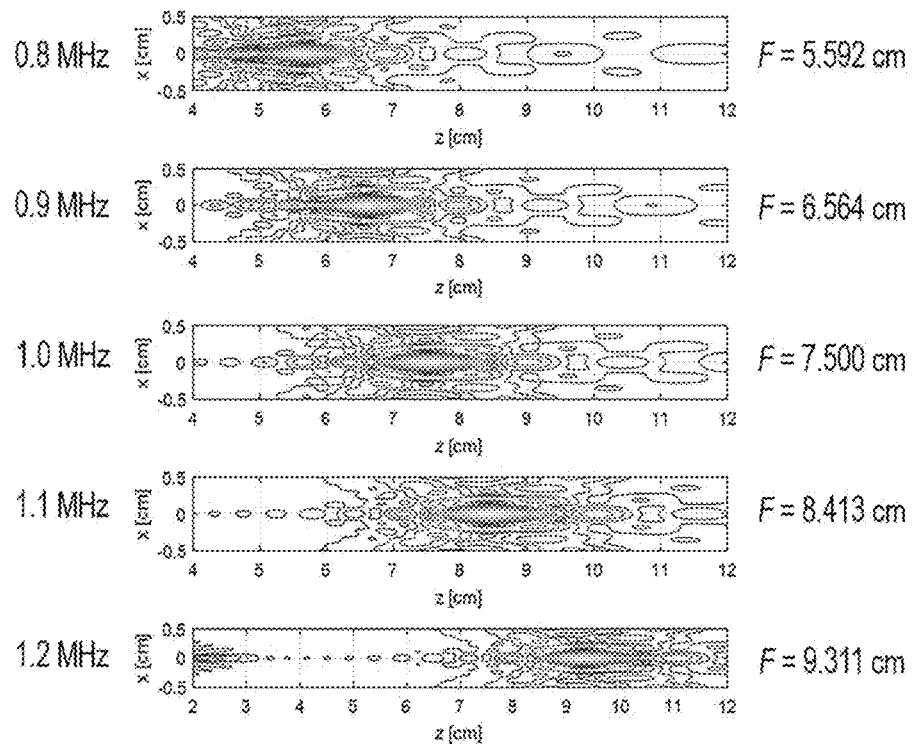
FIG. 16 shows sound-field spatial distribution diagrams showing changes in a focal length according to frequency variations according to the first and the second embodiments of the present invention.
Figure 17A:
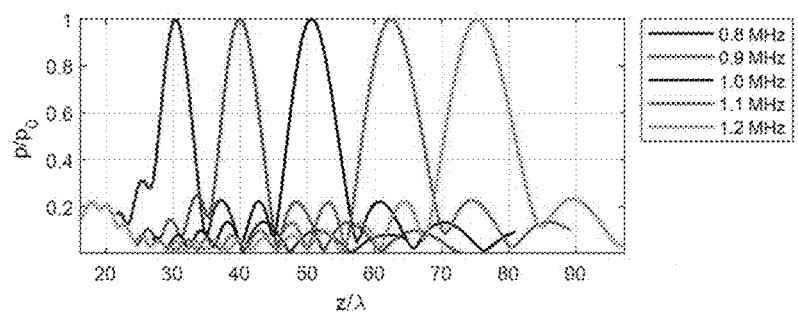
FIG. 17A is a comparative graph showing changes in a focal length according to frequency variations according to the first and the second embodiments of the present invention.

FIG. 16 shows sound-field spatial distribution diagrams showing changes in a focal length according to frequency variations according to the first and the second embodiments of the present invention, and FIG. 17A is a comparative graph showing changes in a focal length according to frequency variations according to the first and the second embodiments of the present invention.

As shown in FIG. 16, it can be seen that focusing is allowable at frequencies besides a set frequency but a focal length is changed. As the frequency becomes lower, the focal length is shortened, while as the frequency becomes higher, the focal length is increased. Even though a resonance frequency is formed which is either lower or higher than the substantially set frequency by manufacturing tolerance, it is allowable to use an effective focal length through calculation.

In the designing method according to the first embodiment of the present invention, when the flat-plate focusing ultrasonic transducers is driven with a frequency besides a frequency of a set sound wave, an effective focal length is calculated by Equation 5.

$$F_{\textit{eff}} \approx \frac{1}{2\pi k}\sqrt{k^4(a_{2(i-1)}^2 - a_{2i-1}^2)^2 - 2\pi^2 k^2(a_{2(i-1)}^2 + a_{2i-1}^2) + \pi^4} \quad \text{[Equation 5]}$$

where, $a_{2(i-1)}$ is an outer diameter of an $i_{th}$ piezoelectric ring, $a_{2i-1}$ is an inner diameter of an $i_{th}$ piezoelectric ring.

Further, in the designing method according to the second embodiment of the present invention, when the flat-plate focusing ultrasonic transducer is driven with a frequency besides the frequency of the set sound wave, an effective focal length is calculated by following Equation 6:

$$F_{\textit{eff}} \approx \frac{1}{2\pi k}\sqrt{k^4(b_{2i-1}^2 - b_{2(i-1)}^2)^2 - 2\pi^2 k^2(b_{2i-1}^2 + b_{2(i-1)}^2) + \pi^4} \quad \text{[Equation 6]}$$

where, $b_{2(i-1)}$ is an inner diameter of an $i_{th}$ piezoelectric ring, $b_{2i-1}$ is an outer diameter of an $i_{th}$ piezoelectric ring.

Figure 17B:
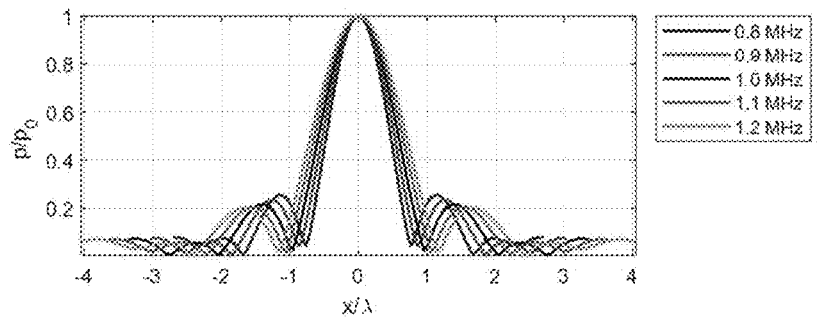
FIG. 17B is a comparative graph of beam widths of a major axis according to frequency variations according to the first and the second embodiments of the present invention.

Further, FIG. 17B is a comparative graph of widths of focusing beams of major axes according to frequency variations according to the first and the second embodiments of the present invention. As shown in FIG. 17B, it can be seen that it is allowable to adjust the width of the major axis of the focusing beam according to the frequency.

Hereinafter, described is a manufacturing method of flat-plate focusing ultrasonic transducer or an acoustic lens which is composed of the aforementioned annular array piezoelectric element according to the embodiment of the present invention.

Figure 18:
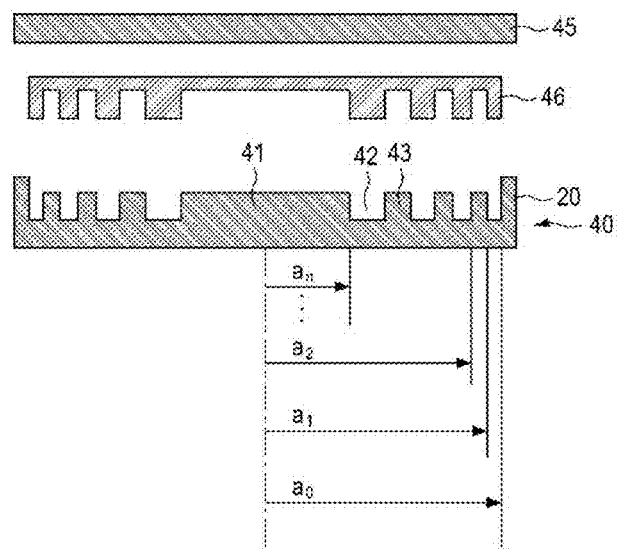
FIG. 18 to FIG. 19 are cross-sectional views by manufacturing steps of a flat-plate focusing ultrasonic transducer composed of an annular array piezoelectric element according to the first embodiment of the present invention.
Figure 19:
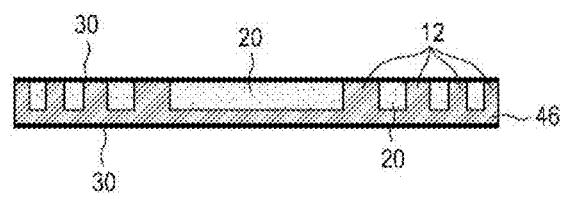

Further, FIG. 18 to FIG. 19 are cross-sectional views by manufacturing steps of a flat-plate focusing ultrasonic transducer composed of an annular array piezoelectric element according to the first embodiment of the present invention.

In the first embodiment of the present invention, a mold 40 is adopted. As shown in FIG. 18, the mold 40 is manufactured which has a disc shaped protrusion portion 41 in a center portion 61, wherein a concave portion 42 and a convex portion 43 which have a concentric shape and correspond to each radius of the concentric regions according to the first and second embodiments of the present invention are sequentially formed in a radius direction in such a protrusion portion 41. The outermost step of the mold 40 is composed of a boundary step 44 of which height is higher than the convex portion 43, and an inner diameter thereof falls into a designed maximum radius.

Further, a piezoelectric material is filled into the mold 40. At this time, it is preferable to design a thickness of a focusing ultrasonic transducer or an acoustic lens to be manufactured to the extent of a half of the quotient obtained by dividing a longitudinal wave of sound speed by a frequency. The filled piezoelectric material is sealed by combining a cap with an upper portion of the mold 40.

Further, following removal of the cap, the piezoelectric material is subjected to desorption.

Further, as shown in FIG. 19, a sound insulator is filled into a region formed by the protrusion portion 41 and the convex portion 43 of the mold 40, and the electro layers are coated on both sides thereof. Then, a high voltage polarizer is connected to the electrode layers 30 on a high temperature chamber, followed by cooling at room temperature to complete the manufacturing process.

Figure 20A:
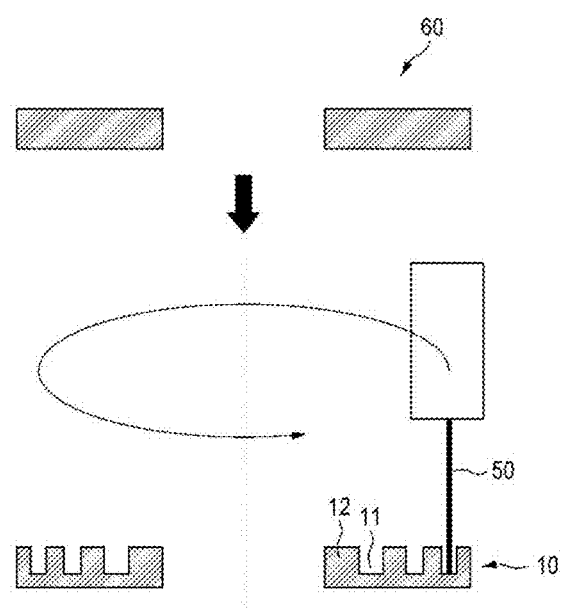
FIG. 20A to FIG. 20C are cross-sectional view of views by manufacturing steps of a flat-plate focusing ultrasonic transducer composed of an annular array piezoelectric element according to the second embodiment of the present invention.
Figure 20B:
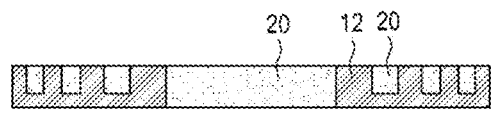
Figure 20C:
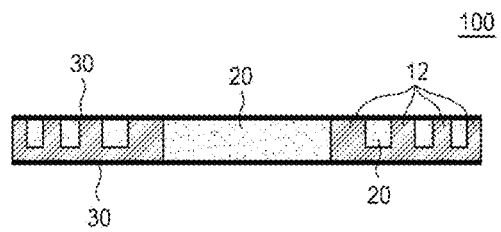

FIG. 20A to FIG. 20C are cross-sectional view of views by manufacturing steps of a flat-plate focusing ultrasonic transducer composed of an annular array piezoelectric element according to the second embodiment of the present invention.

Firstly, a base material of a piezoelectric ring 60 is prepared which has a maximum radius and a minimum radius designed according to the designing methods according to the first and second embodiments and which is in a form without electrode in which polarization was completed.

Further, as shown in 20A, while the base material of a piezoelectric ring 60 is rotated with respect to the center point, the sound insulation regions 11 are formed by etching through laser 50 to coincide with each radius of concentric regions according to the designing methods according to the first and second embodiments. Further, as shown in FIG. 20B, the sound insulator 20 is filled into the sound insulation regions 11 and as shown in FIG. 20C, the electro layers are coated on both sides thereof to complete the manufacturing process.

FIG. 21A to FIG. 21D are cross-sectional views by manufacturing steps of a flat-plate focusing ultrasonic transducer composed of an annular array piezoelectric element according to a third embodiment of the present invention. Firstly, the base material of a piezoelectric ring 60 is prepared which has a maximum radius ($a_0$) designed according to the aforementioned designing methods according to the first and second embodiments and which is in a form without electrode in which polarization was completed.

Figure 21A:
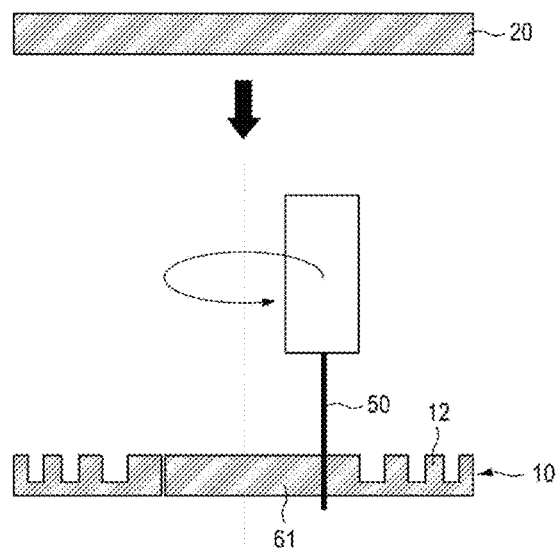
FIG. 21A to FIG. 21D are cross-sectional views by manufacturing steps of a flat-plate focusing ultrasonic transducer composed of an annular array piezoelectric element according to a third embodiment of the present invention.
Figure 21B:
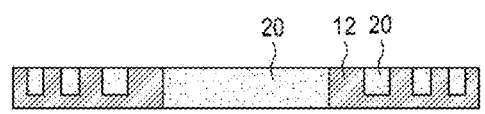
Figure 21C:
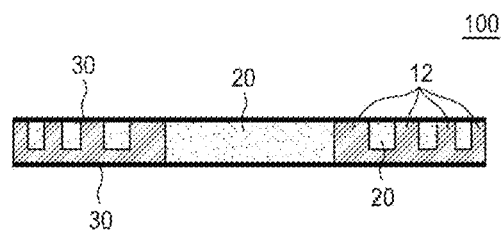
Figure 21D:
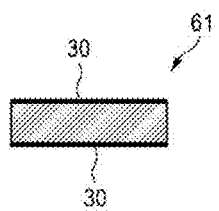

Further, as shown in FIG. 21A, while the base material of a piezoelectric ring 60 is rotated with respect to the center point, the center portion 61 is removed by irradiating the laser 50 so as to form, in the base material of a piezoelectric ring 60, a center through portion corresponding to the minimum radius designed according to the designing methods according to the first and second embodiments. Further, while the base material of a piezoelectric ring 60 is rotated with respect to the center point, the sound insulation regions 11 are formed by etching through laser 50 to coincide with each radius of concentric regions according to the designing method of the first and second embodiments. Then, as shown in FIG. 21B, the sound insulator 20 is filled into the center through portion and the sound insulations 11 and as shown in FIG. 21C, the electrode layers 30 are coated on both sides thereof to complete the manufacturing process. Further, as shown in FIG. 21C, following the coating step, the center point 61 (piezoelectric disc) remaining after being removed in the process is recyclable for the manufacture of a transducer having a diameter of $a_n$.

FIG. 22A to FIG. 22E are cross-sectional views by manufacturing steps of a flat-plate focusing ultrasonic transducer composed of an annular array piezoelectric element according to a fourth embodiment of the present invention.

Firstly, the base material of a piezoelectric ring 60 is prepared which has a maximum radius ($a_0$) designed according to the aforementioned designing methods according to the first and second embodiments and which is in a form without electrode in which polarization was completed.

Figure 22A:
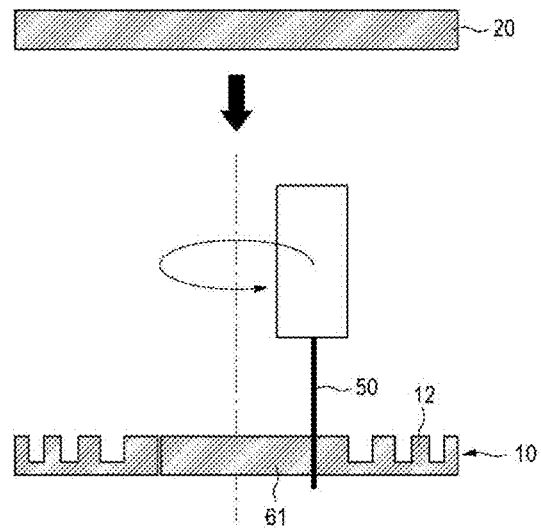
FIG. 22A to FIG. 22E are cross-sectional views by manufacturing steps of a flat-plate focusing ultrasonic transducer composed of an annular array piezoelectric element according to a fourth embodiment of the present invention.
Figure 23:
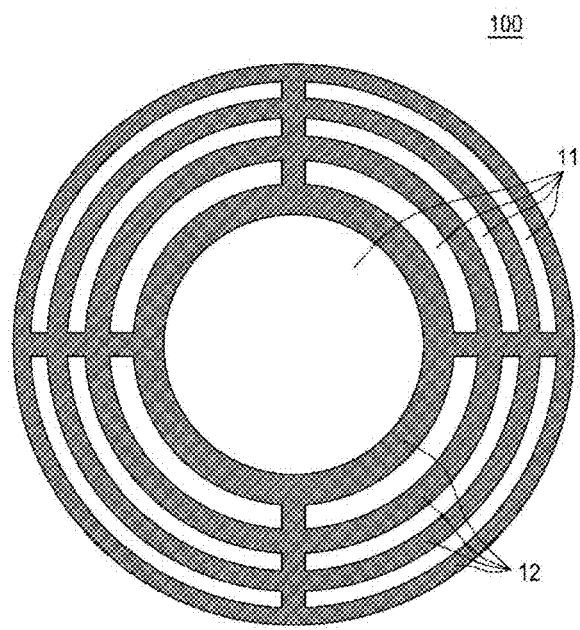
FIG. 23 is a plane view of a flat-plate focusing ultrasonic transducer composed of an annular array piezoelectric element according to another embodiment of the present invention.

Further, as shown in FIG. 22A, while the base material of a piezoelectric ring 60 is rotated with respect to the center point, the center portion 61 is removed by irradiating the laser 50 so as to form, in the base material of a piezoelectric ring 60, the center through portion corresponding to the minimum radius designed according to the designing methods according to the first and second embodiments. Further, while the base material of a piezoelectric ring 60 is rotated with respect to the center point, the sound insulation regions 11 are formed by etching through laser 50 to coincide with each radius of concentric regions according to the designing method according to the first and second embodiments. FIG. 23 is a plane view of a flat-plate focusing ultrasonic transducer composed of an annular array piezoelectric element according to another embodiment of the present invention. It is allowable to form a pattern like FIG. 23 in the etching process.

Figure 22B:

As shown in FIG. 22B, the sound insulator 20 is filled into the sound insulation region 11, and an insulation insert is inserted into an inside of the center through portion formed on the center portion 61.

Figure 22C:
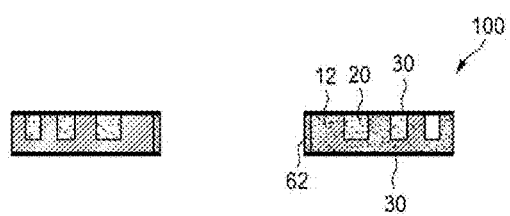
Figure 22D:
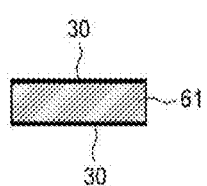
Figure 22E:
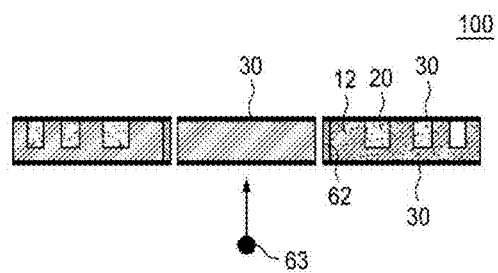

Further, as shown in FIG. 22C, the electrode layers 30 are coated on both sides thereof and as shown in FIG. 22D, the electrode layers 30 are coated on both sides of the removed center portion 61 (piezoelectric disc). Then, as shown in FIG. 22E, the center portion 61 (piezoelectic disc) coated with the electrode layers 30 are inserted into and coupled to the center through portion, allowing manufacturing a transducer in which oscillation occurs in an external ring (scatterer 63) and a signal is received in the central disc.

Further, the aforementioned apparatus and method are not limited to configurations and methods of the above-described embodiments. Alternatively, the embodiments may be configured by selectively combining the whole of the respective embodiments or a part thereof to allow various modifications.

DESCRIPTION OF THE SYMBOLS

1: a conventional ultrasonic transducer
2: a conventional spherical acoustic lens
10: an annular array piezoelectric element
11: a sound insulation region
12: a piezoelectric region, a piezoelectric ring
20: a sound insulator
30: an electrode layer
40: a mold
41: a protrusion portion
42: a concave portion
43: a convex portion
44: a boundary step
50: laser
60: a base material of a piezoelectric ring
61: a piezoelectric disc, a center portion
62: an insulation insert
63: a scatterer
100: a focusing ultrasonic transducer composed of an annular array piezoelectric element, an acoustic lens

What is claimed is:

1. A flat-plate focusing ultrasonic transducer composed of an annular array piezoelectric element, wherein
the annular array piezoelectric element has a plurality of concentric regions which is concentrically arranged in a concentric circle shape with respect to a center point, the concentric region has ring shaped sound insulation regions and piezoelectric regions which are alternatively formed in a direction from the center point to a radius direction, so as to focus a sound wave near a focal point, wherein the piezoelectric regions are composed of a piezoelectric ring that is composed of a piezoelectric material and thus excites a sound wave, the concentric region is in a shape of a flat-plate of which both sides are flat and which has a constant thickness, and each radius of the plurality of the sound insulation regions and the piezoelectric regions in the concentric region are calculated based on a set focal length of the ultrasonic transducer and a frequency of a set sound wave, wherein a maximum radius is determined and fixed, and the each radius of the plurality of the sound insulation regions and the piezoelectric regions in the concentric region are calculated by following Equation 3:

$$a_n = \frac{1}{k}\sqrt{(k^2 a_0^2 + (n\pi)^2) - 2n\pi k\sqrt{a_0^2 + F^2}} \quad \text{[Equation 3]}$$

where $a_n$ is an index of the sequential concentric regions in a direction from the maximum radius to an inner radius, $a_0$ is the maximum radius ($R_0$), k is a wave number, and F is a focal length.

2. The flat-plate focusing ultrasonic transducer composed of an annular array piezoelectric element according to claim 1, wherein a minimum radius is determined and fixed, and the each radius of the plurality of the sound insulation regions and the piezoelectric regions in the concentric region are calculated by following Equation 4:

$$b_n = \frac{1}{k}\sqrt{2n\pi k\sqrt{b_0^2 + F^2} + (k^2 b_0^2 + (n\pi)^2)} \quad \text{[Equation 4]}$$

where $b_n$ is an index of the sequential concentric regions in a direction from a primary radius to an outer radius, $b_0$ is the primary radius ($R_b$), k is a wave number, and F is a focal length.

3. The flat-plate focusing ultrasonic transducer composed of an annular array piezoelectric element according to claim 1, further comprising electrode layers to be laminated on each of the both sides.

4. The flat-plate focusing ultrasonic transducer composed of an annular array piezoelectric element according to claim 1, wherein a sound insulation material composing the sound insulation regions is air or a sound insulator, the sound insulator having a composite material which induces a scattering process of a sound wave and a matrix material which fills a base of an acoustic absorbent during the scattering process of the sound wave.

5. The flat-plate focusing ultrasonic transducer composed of an annular array piezoelectric element according to claim 1, wherein the focal length is fixed even if changing the number of the piezoelectric rings, and length and width of a major axis of a focused beam are adjustable by changing the number of the piezoelectric rings.

6. The flat-plate focusing ultrasonic transducer composed of an annular array piezoelectric element according to claim 1, wherein when the flat-plate focusing ultrasonic transducer is driven with a frequency besides the frequency of the set sound wave, an effective focal length is calculated by following Equation 5:

$$F_{eff} \approx \frac{1}{2\pi k}\sqrt{k^4(a_{2(i-1)}^2 - a_{2i-1}^2)^2 - 2\pi^2 k^2(a_{2(i-1)}^2 + a_{2i-1}^2) + \pi^4} \quad \text{[Equation 5]}$$

where, $a_{2(i-1)}$ is an outer diameter of an $i_{th}$ piezoelectric ring, $a_{2i-1}$ is an inner diameter of an $i_{th}$ piezoelectric ring.

7. The flat-plate focusing ultrasonic transducer composed of an annular array piezoelectric element according to claim 2, wherein when the flat-plate focusing ultrasonic transducer is driven with a frequency besides the frequency of the set sound wave, an effective focal length is calculated by following Equation 6:

$$F_{eff} \approx \frac{1}{2\pi k}\sqrt{k^4(b_{2i-1}^2 - b_{2(i-1)}^2)^2 - 2\pi^2 k^2(b_{2i-1}^2 + b_{2(i-1)}^2) + \pi^4} \quad \text{[Equation 6]}$$

where, $b_{2(i-1)}$ is an inner diameter of an $i_{th}$ piezoelectric ring, $b_{2i-1}$ is an outer diameter of an $i_{th}$ piezoelectric ring.

8. An acoustic lens comprising the annular array piezoelectric element according to claim 1.

9. A flat-plate focusing ultrasonic transducer composed of an annular array piezoelectric element, wherein the annular array piezoelectric element has a plurality of concentric regions which is concentrically arranged in a concentric circle shape with respect to a center point, the concentric region has ring shaped sound insulation regions and piezoelectric regions which are alternatively formed in a direction from the center point to a radius direction, so as to focus a sound wave near a focal point, wherein the piezoelectric regions are composed of a piezoelectric ring that is composed of a piezoelectric material and thus excites a sound wave, the concentric region is in a shape of a flat-plate of which both sides are flat and which has a constant thickness, and each radius of the plurality of the sound insulation regions and the piezoelectric regions in the concentric region are calculated based on a set focal length of the ultrasonic transducer and a frequency of a set sound wave, wherein a minimum radius is determined and fixed, and the each radius of the plurality of the sound insulation regions and the piezoelectric regions in the concentric region are calculated by following Equation 4:

$$b_n = \frac{1}{k}\sqrt{2n\pi k\sqrt{b_0^2 + F^2} + (k^2 b_0^2 + (n\pi)^2)} \quad \text{[Equation 4]}$$

where $b_n$ is an index of the sequential concentric regions in a direction from a primary radius to an outer radius, $b_0$ is the primary radius ($R_b$), k is a wave number, and F is a focal length.

10. The flat-plate focusing ultrasonic transducer composed of an annular array piezoelectric element according to claim 9, wherein a maximum radius is determined and fixed, and the each radius of the plurality of the sound insulation regions and the piezoelectric regions in the concentric region are calculated by following Equation 3:

$$a_n = \frac{1}{k}\sqrt{(k^2 a_0^2 + (n\pi)^2) - 2n\pi k\sqrt{a_0^2 + F^2}} \quad \text{[Equation 3]}$$

where $a_n$ is an index of the sequential concentric regions in a direction from the maximum radius to an inner radius, $a_0$ is the maximum radius ($R_0$), k is a wave number, and F is a focal length.

11. The flat-plate focusing ultrasonic transducer composed of an annular array piezoelectric element according to claim 9, further comprising electrode layers to be laminated on each of the both sides.

12. The flat-plate focusing ultrasonic transducer composed of an annular array piezoelectric element according to claim 9, wherein a sound insulation material composing the sound insulation regions is air or a sound insulator, the sound insulator having a composite material which induces a scattering process of a sound wave and a matrix material which fills a base of an acoustic absorbent during the scattering process of the sound wave.

13. The flat-plate focusing ultrasonic transducer composed of an annular array piezoelectric element according to claim 9, wherein the focal length is fixed even if changing the number of the piezoelectric rings, and length and width of a major axis of a focused beam are adjustable by changing the number of the piezoelectric rings.

14. The flat-plate focusing ultrasonic transducer composed of an annular array piezoelectric element according to claim 10, wherein when the flat-plate focusing ultrasonic transducer is driven with a frequency besides the frequency of the set sound wave, an effective focal length is calculated by following Equation 5:

$$F_{\mathit{eff}} \approx \frac{1}{2\pi k}\sqrt{k^4\left(a_{2(i-1)}^2 - a_{2i-1}^2\right)^2 - 2\pi^2 k^2\left(a_{2(i-1)}^2 + a_{2i-1}^2\right) + \pi^4} \quad \text{[Equation 5]}$$

where, $a_{2(i-1)}$ is an outer diameter of an $i_{th}$ piezoelectric ring, $a_{2i-1}$ is an inner diameter of an $i_{th}$ piezoelectric ring.

15. The flat-plate focusing ultrasonic transducer composed of an annular array piezoelectric element according to claim 9, wherein when the flat-plate focusing ultrasonic transducer is driven with a frequency besides the frequency of the set sound wave, an effective focal length is calculated by following Equation 6:

$$F_{\mathit{eff}} \approx \frac{1}{2\pi k}\sqrt{k^4\left(b_{2i-1}^2 - b_{2(i-1)}^2\right)^2 - 2\pi^2 k^2\left(b_{2i-1}^2 + b_{2(i-1)}^2\right) + \pi^4} \quad \text{[Equation 6]}$$

where, $b_{2(i-1)}$ is an inner diameter of an it piezoelectric ring, $b_{2i-1}$ is an outer diameter of an $i_{th}$ piezoelectric ring.

16. An acoustic lens comprising the annular array piezoelectric element according to claim 9.

\* \* \* \* \*